United States Patent [19]

Kim

[11] Patent Number: 5,680,502

[45] Date of Patent: Oct. 21, 1997

[54] THIN FILM HEAT TREATMENT APPARATUS WITH CONDUCTIVELY HEATED TABLE AND SURROUNDING RADIATION SHIELD

[75] Inventor: Yong-Kil Kim, Santa Clara, Calif.

[73] Assignee: Varian Associates, Inc., Palo Alto, Calif.

[21] Appl. No.: 362,026

[22] Filed: Apr. 3, 1995

[51] Int. Cl.[6] .............................. F27B 5/10; H01L 21/20; C23C 16/00
[52] U.S. Cl. ..................... 392/416; 219/405; 118/725; 118/728
[58] Field of Search ........................ 392/418, 416; 219/405, 411, 390; 118/724, 725, 728, 730, 50.1; 437/247

[56] References Cited

U.S. PATENT DOCUMENTS

| | | | |
|---|---|---|---|
| 3,293,074 | 12/1966 | Nickl | 118/724 |
| 4,466,793 | 8/1984 | Murakami et al. | 432/253 |
| 4,539,933 | 9/1985 | Campbell et al. | 118/724 |
| 4,693,211 | 9/1987 | Ogami et al. | 118/725 |
| 4,721,462 | 1/1988 | Collins, Jr. | 432/253 |
| 4,857,704 | 8/1989 | Jannot et al. | 392/416 |
| 5,011,794 | 4/1991 | Grim et al. | 437/247 |
| 5,090,900 | 2/1992 | Rudolf et al. | 432/239 |
| 5,183,402 | 2/1993 | Cooke et al. | 432/5 |
| 5,518,593 | 5/1996 | Hosokawa et al. | 118/724 |

FOREIGN PATENT DOCUMENTS

| | | | |
|---|---|---|---|
| 61-139024 | 6/1986 | Japan . | |
| 2-238616 | 9/1990 | Japan | 392/418 |
| 3-291940 | 12/1991 | Japan . | |
| 443234 | 9/1974 | U.S.S.R. | 392/418 |

Primary Examiner—Teresa J. Walberg
Assistant Examiner—J. Pelham
Attorney, Agent, or Firm—Bella Fishman

[57] ABSTRACT

The thin film heat treatment apparatus for heating the wafers or foil sheets provides a conductively heated table disposed within a vacuum chamber, a heat radiation preventing device that is installed adjacent to the conductively heated table and forms a space with the top of the heater table by surrounding the foil sheet or wafer placed on the top of the heater table.

7 Claims, 5 Drawing Sheets

THIN FILM HEAT TREATMENT APPARATUS WITH CONDUCTIVELY HEATED TABLE AND SURROUNDING RADIATION SHIELD

FIELD OF THE INVENTION

This invention concerns a heat treatment device. In more detail, it pertains to a foil sheet heat treatment device that uses a secondarily formed space by heating a wafer to a fixed temperature in the process of making a foil sheet or semiconductor.

BACKGROUND OF THE INVENTION

In commercial semiconductor manufacture, a heat treatment process is performed to improve the quality of the adhering thin metal film after bonding to the top of the wafer, or to make the aluminum film uniform by heating the wafer continuously on the high-temperature heater table. This induces self-diffusion after the aluminum film is formed at a low temperature in the case in which the electrode of the device connected to the silicon on the wafer is coated with aluminum.

FIG. 1 shows one example of the heat treatment device that performs heat treatment in the manufacture of semiconductors.

In this device, flange (11a) situated along the circumference of housing (11) is fixed to housing flange (101) that is arranged at the lower part of vacuum chamber (100), and heater table (12) is installed to the hollow center section (11b) of housing (11). In addition, clamp (15) is installed at flange section (11a) of housing (11) to retain wafer (200) that is positioned on heater table (12). Clamping device (15) is installed at flange section (11a) of housing (11) so that clamp rod (15a) ascended by a first lifting device (16) can slide back and forth. At the crossing of clamp rod (15a), torroidal clamp (17) is fixed and installed as shown in FIG. 2. In order to receive wafer (200) supplied from the fixed manipulator (not shown), center rod (18) is installed at heater table (12) so as to submerge or protrude at a fixed length from the surface of heater table (12) by a second lifting device (19). Herein, lifting devices (16,19) are bellows whose crossing sections are connected to clamp rod (15a) and center rod (18).

In order to heat wafer (200) using the conventional heat treatment device, clamp rod (15a) was elevated by first lifting device No. 1 (16) so that clamp (17) is situated at a fixed distance from heater table (12). In addition, center rod (18) installed at heater table (12) was raised by second lifting device (19) so that the center rod protrudes from the surface of heater table (12).

If wafer (200) is supplied to center rod (18) from the fixed manipulator at this stage, center rod (18) is descended by second lifting device No. 2 (19) and wafer (200) for heat treatment will be placed on the top of heater table (12). When wafer (200) is placed on the top of heater table (12) lifting first device (16) is operated to lower clamp rod (15a) so that clamp (17) installed on the crossing section of the clamp rod contacts close to the surface of heater table (12) and the edge of the wafer (200) is clamped against heater table (12). If wafer (200) is fixed to heater table (12), an electric heating wire, which is a heating device immersed and fixed to heater table (12), generates heat to treat wafer (200) at a fixed temperature.

However, when using the heat treatment device for wafer (200) as mentioned above, the following problems occur because the surface of heater table (12) and wafer (200) fixed to clamp (17) are exposed to vacuum chamber (100) in the process of heat treatment.

First, since the bottom part of the wafer is in contact with the top of the heater table and the top of the table is exposed to the vacuum chamber, all parts of the wafer cannot be heated to a uniform temperature.

Second, severe heat losses caused by the exposure of the heater table to the vacuum chamber require a device that radiates large amounts of heat.

Third, it takes a great deal of time to heat the wafer from a low temperature to a high temperature.

Fourth, since a longer wafer heating time increases the impurity absorption rate, diffusion of a metal film (for example, aluminum film) onto the surface of the wafer is delayed, and therefore productivity improvements cannot be achieved.

This invention is designed to solve the aforementioned problems by heating the metal sheet or wafer to a uniform temperature, and by providing a second space in the heat treatment device so that the impurity adsorption rate can be reduced sharply at the metal sheet or wafer surface.

Another objective of this invention is to provide a foil sheet heat treatment device utilizing a secondarily formed space, which can shorten the heating time, and thus increase productivity by improving the heating efficiency of the heater table, and subsequently, the heating of the metal sheet or wafer at high temperatures.

SUMMARY OF THE INVENTION

To achieve the above objectives, this invention is equipped with a heat radiation preventing device, which utilizes a second space that is made above the surface of the heater table and wraps the wafer foil sheet on top of the heater table by installing the heater table adjacent to vacuum chamber.

BRIEF DESCRIPTION OF THE DRAWINGS

The invention is described in greater detail hereinafter relative to non-limitative embodiments and with respect to the attached drawings wherein.

DETAILED DESCRIPTION OF THE INVENTION

Figure 1:
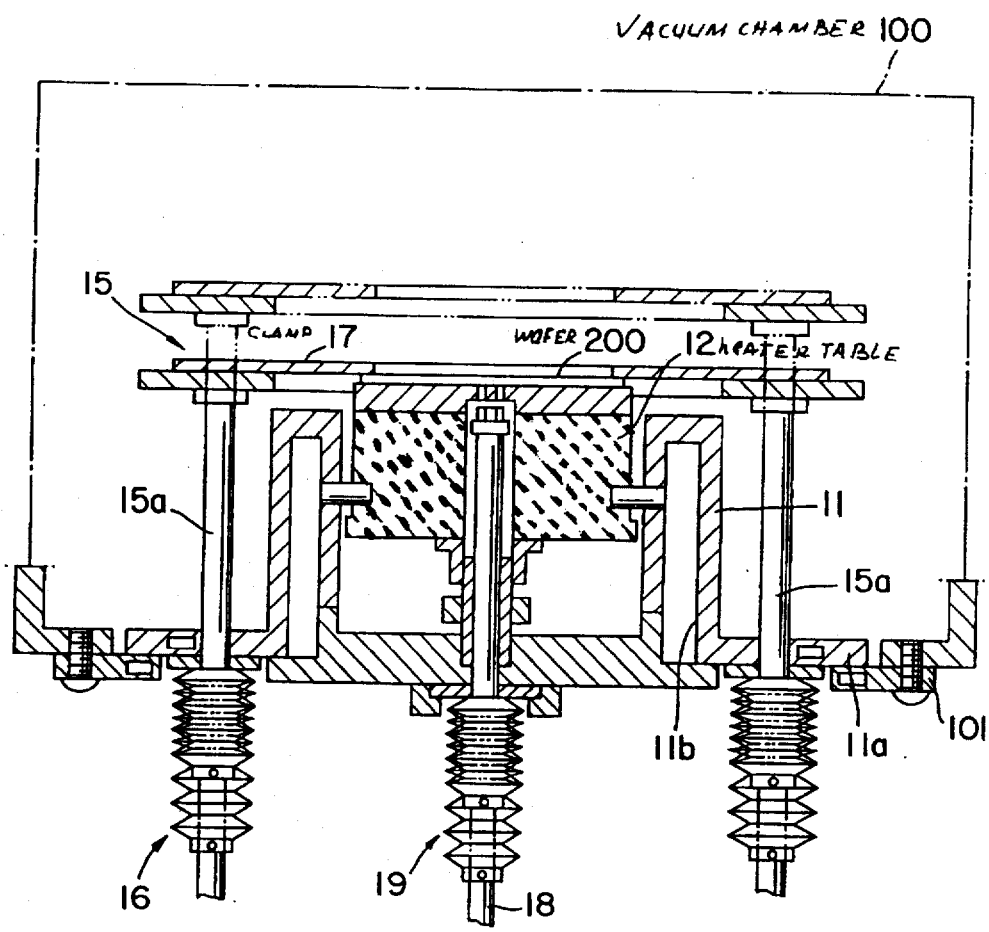
FIG. 1 shows a cross-sectional view of the conventional heat treatment device.
Figure 2:
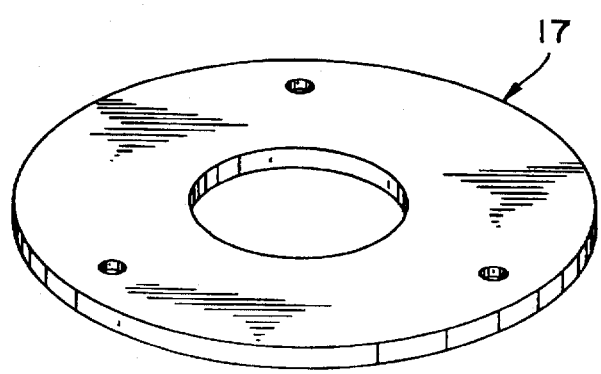
FIG. 2 shows a top view of the clamp excerpted from FIG. 1.
Figure 3:
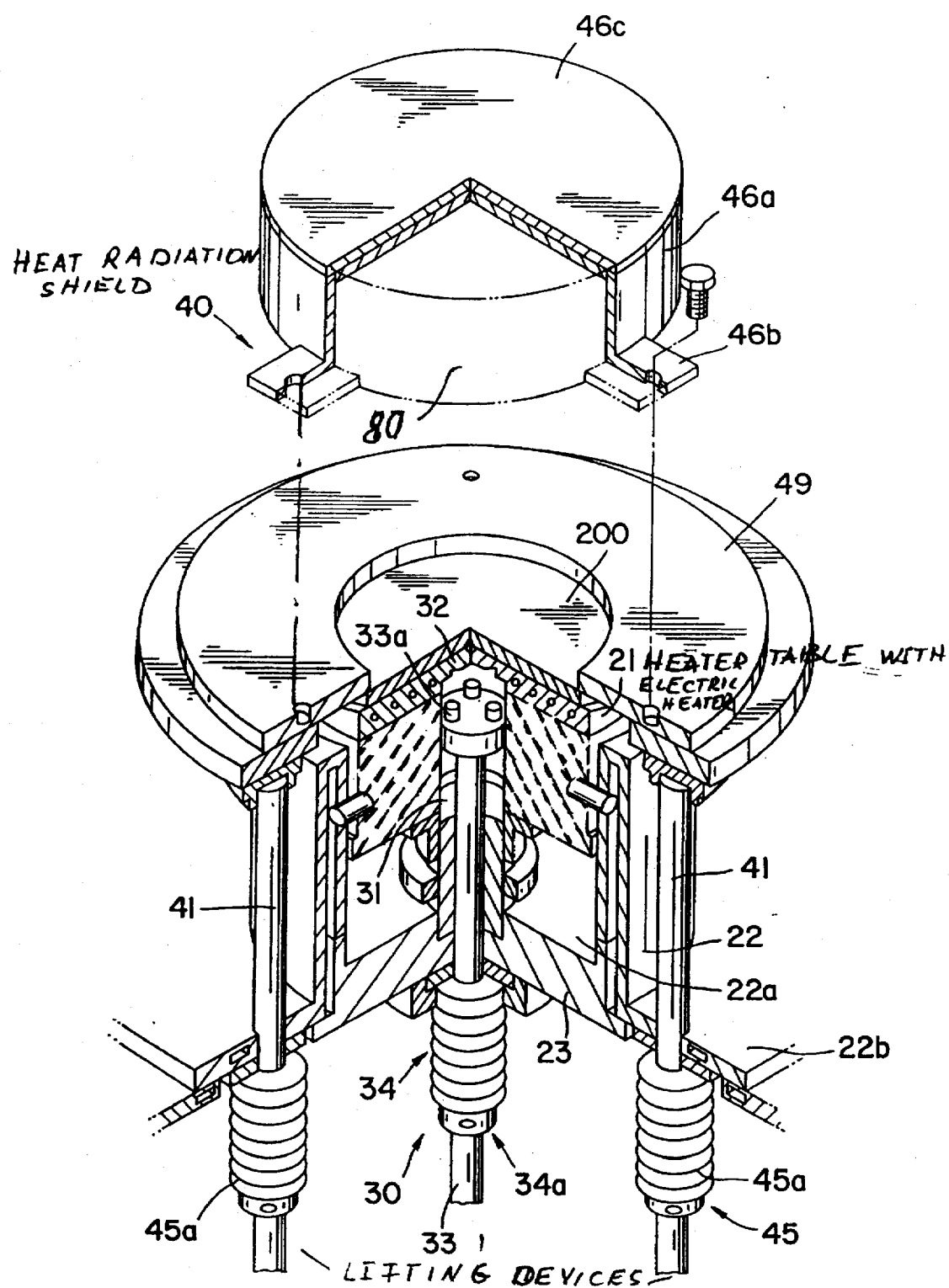
FIG. 3 shows a three-dimensional exploded view of the foil plate heat treatment device using a secondarily formed space according to this invention.
Figure 4:
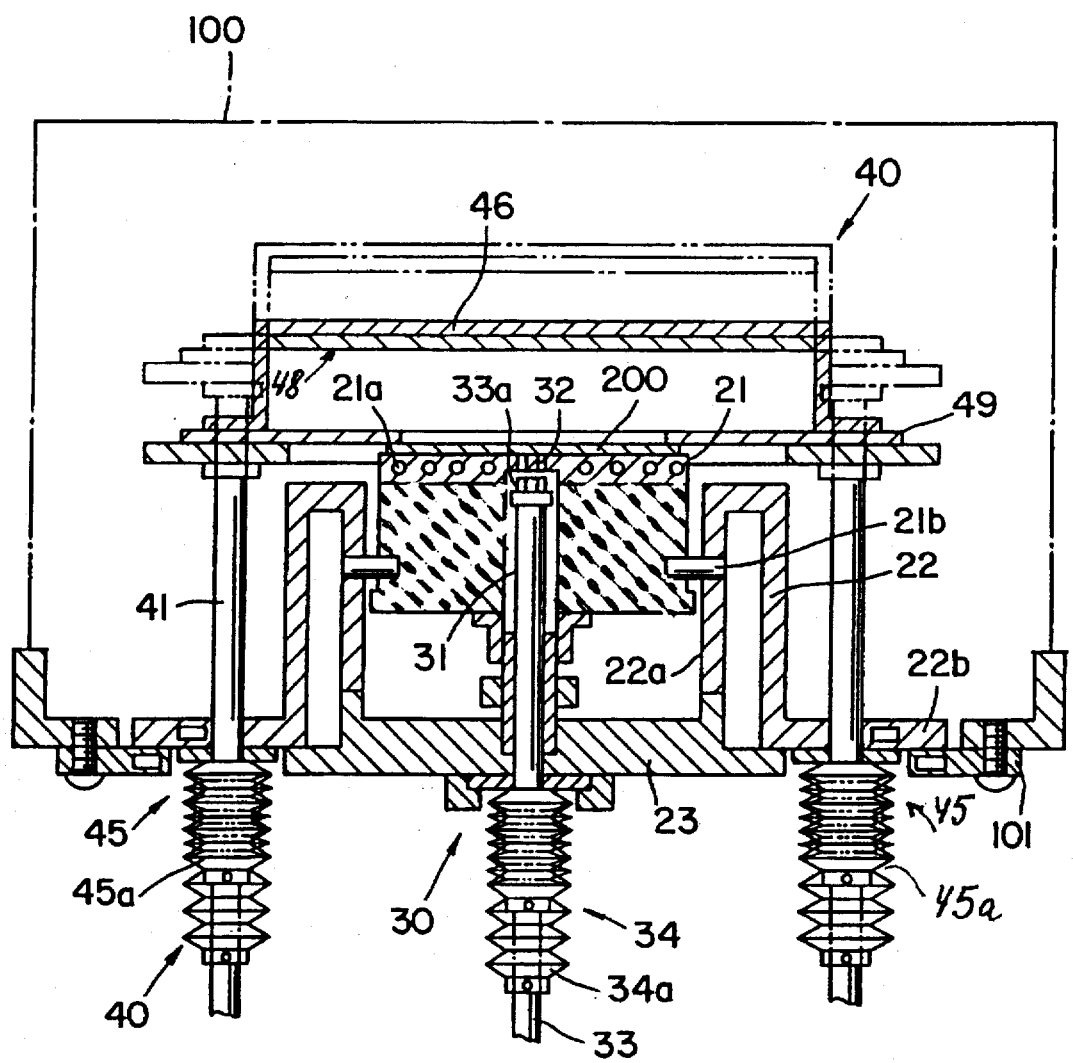
FIG. 4 shows a cross-sectional view of the foil film heat treatment device using a secondarily formed space according to this invention and illustrates operational state.

FIGS. 3 and 4 illustrate the heat treatment device of this invention.

The heat treatment device comprises a vacuum chamber (100), a heater table (21) installed in vacuum chamber (100) and electric heating wire (21a) which is immersed and fixed to, a reception device (30) that is installed at the center of heater table (21) to receive a wafer (200). A heat radiation preventing device (40) forms a second space (80) selectively within vacuum chamber (100) by contacting the surface of the heater to the lifting device that is installed adjacent to heater table (21) or by separating them.

When installing heater table (21) inside vacuum chamber (100), flange (22b) of housing (22) with a hollow center (22a) is fixed to mount flange (101) of vacuum chamber (100) so that upper part of horning (22) is placed inside vacuum chamber (100). Heat base (23) is installed at the lower part of housing (22) so as to seal the lower part of housing (23) airtight. Heater table (21) immersed with a heating device, electric heating wire (21a), is installed at the upper part of hollow center (22a) in housing (22) by pins (21b) located along its circumference. In this case, the use of a halogen lamp that is installed adjacent to the table is allowed as a heat generating device.

The reception device (30) is installed on the hollow center of heater table (21) to receive a foil sheet or wafer (200) supplied from a manipulator (not shown) and to place it on the top of heater table (21) for heat treatment on the top of heater table (21). A cylindrical guide hole (31) is formed perpendicular to the center of the above heater table (21), and the upper part of guide hole (31) is connected to at least three penetrating spaces (3d) formed at fixed intervals from the center of heater table (21). The crossing part of center rod (33), which is installed on heater base (23) so that it can slide back and forth, is located at guide hole (31). Pins (33a) to be slid through penetrating space (32), are installed on the cross section of center rod (33). The lower cross section of center rod (33) is connected to the cross section of bellows (34a), second lifting device (34) that is fixed at heater base (23).

Figure 5:
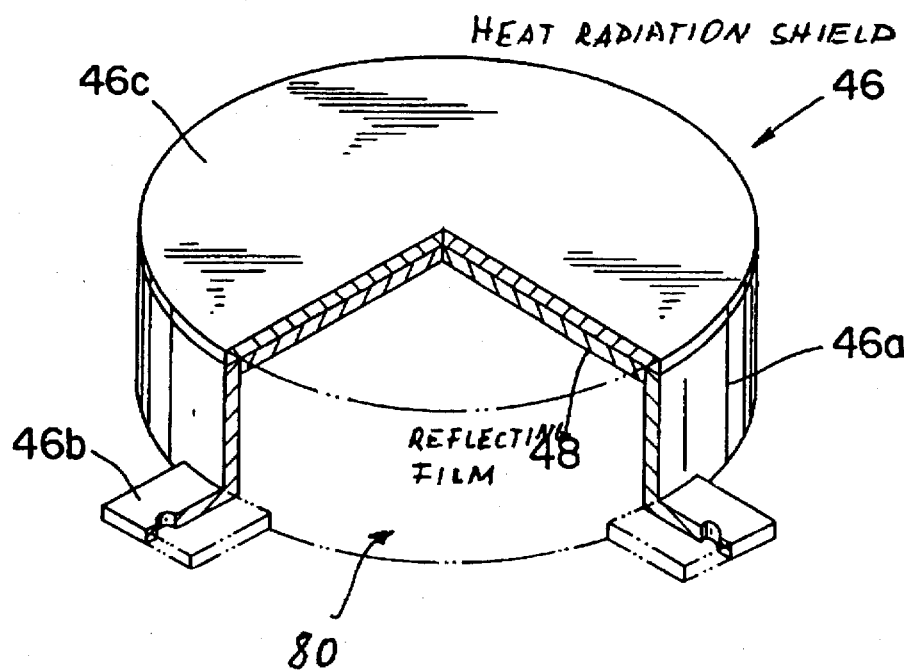
FIG. 5 shows a three-dimensional sectional view of the radiant heat prevention device in the heat treatment device using a secondarily formed space.

The heat radiation preventing device (40) forms a second space that selectively wraps the foil sheet or wafer (200) located on top of heater table (21) within the vacuum chamber (100) and prevents the escape of heat generated from heater table (21). A number of rods (41) are installed at lower flange (21b) of housing (22b) so that they can be elevated by bellows (45a), first lifting device (45) installed at the lower part of the flange. Clamp (49) used to clamp the wafer, and a cap (46) that forms space within vacuum chamber (100) together with the top of heater table (21), are installed on the cross section of rods (41). As shown in FIG. 5, cap (46) above consists of a cylindrical main body (46a), a fixed part that adheres to the surface of each clamp (49) above by extending the fixed length in the direction of diameter at the circumference of main body (46b), and top side (46c) that adjoins with main body (46a). Here, cap (46) can be installed directly on the cross section of rod (41) to wrap wafer (200).

In addition, cap (46) is furnished with gas outflow opening (47). It is desirable that the upper edge of the above cylindrical main body (46a) not be welded to its top part continuously, but at fixed intervals. It is also desirable that the inner surface of cap (46) be formed in a dome shape so that the reflection film coated on the inner surface is in a dome shape to focus the reflected heat in heating the wafer.

It is also desirable that reflective film (48) be formed inside the cap opposite the upper face of the heater table, so as the heat escaping to the surface of heater table (21) may be reflected.

Figure 6:
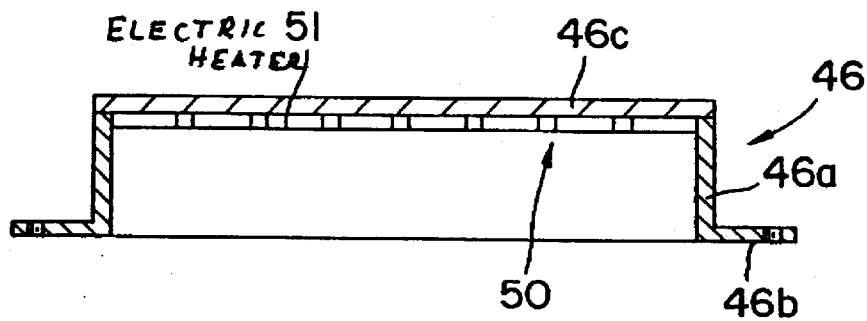
FIG. 6 shows a cross-sectional view of radiant heat prevention device in the other example illustrated in FIG. 2.

As shown in FIG. 6, another embodiment for cap (46) is equipped internally with heat generating device (50) inside cap (46). Electric heater (51) or a halogen lamp are installed at the inner surface of cap (46) of heat generating device (50).

The top side of cap (46) is also equipped with gas injection tube to introduce a fixed amount of gas into the second space for heat treatment of wafer (200).

The heat treatment device lifts the cap with the first lifting device No. 1 installed at the flange of housing (22). Subsequently, the cap comes in close contact with heater table (21) to form a second space. However, it is allowed to elevate heater table (22) above cap (46) and to use various types of lifting devices that can form a space.

The following explains operation of the heat treatment device based on this invention.

In order to treat a foil sheet or wafer (200) with heat, a fixed vacuum pressure is applied to first and second lifting devices No. 1 and No. 2 (45,34), bellows (45a,34a), so that rod (41) and center rod (33) are raised by reducing the volume. By doing this, pins (33a) located on the cross section of center rod (33) project above the surface of heater table (21) through space (32) of heater table (21), and cap (46) of heat radiation preventing device (40) is separated from the top of heater table (21) and located at a fixed distance. In this state, although it is not illustrated in figures, foil sheet or wafer (200) from the manipulator is supplied to the surface of three pins (33a) of the center rod which projects above the top of heater table (27). Therefore, a fixed vacuum pressure is applied to bellows (34a) of center rod (33) to increase the inner volume of bellows (34a). The center rod is lowered, the pins (33a) on the cross section of the center rod (33) are then submerged into through space (32) to place the foil sheet or wafer (200) on top of heater table (21). Bellows (45a), the first lifting device, operates as described above to lower rod (41), to press the edge of wafer (200) by clamp (49), and to form a second space that wraps cap (46) and wafer (200).

When the fixation of wafer (200) onto heater table (21) is complete, electric heating wire (21a) immersed in heater table (21) generates energy to heat wafer (200).

Figure 7:
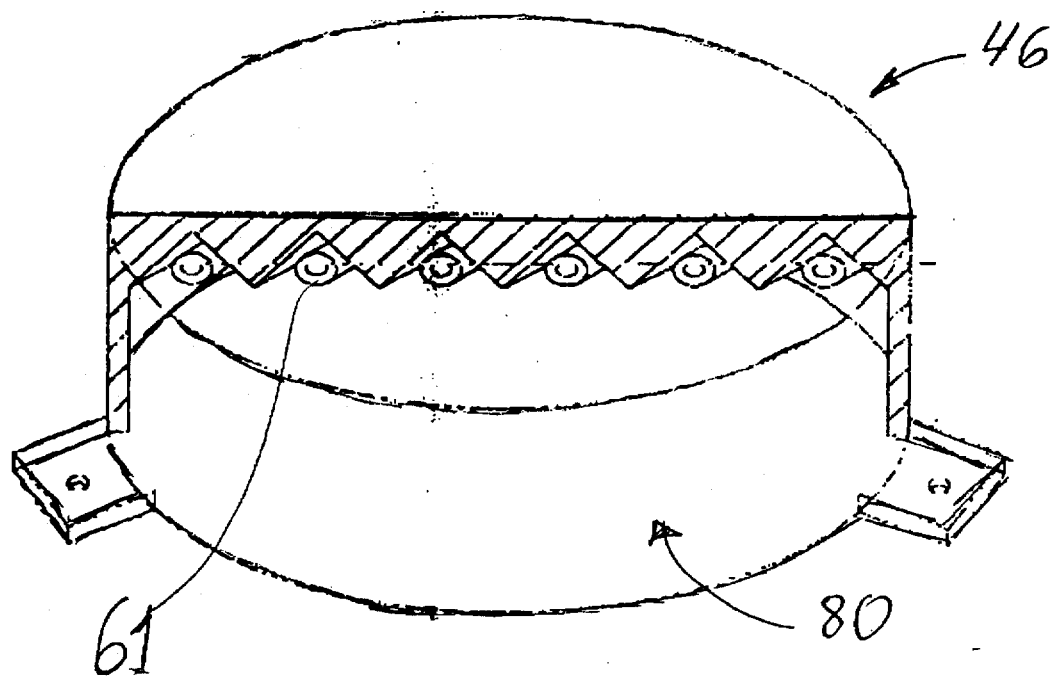
FIG. 7 shows a three-dimensional sectional view of the heat radiation preventing device having a cylindrical main body with halogen lamp incorporated therein.
Figure 8:
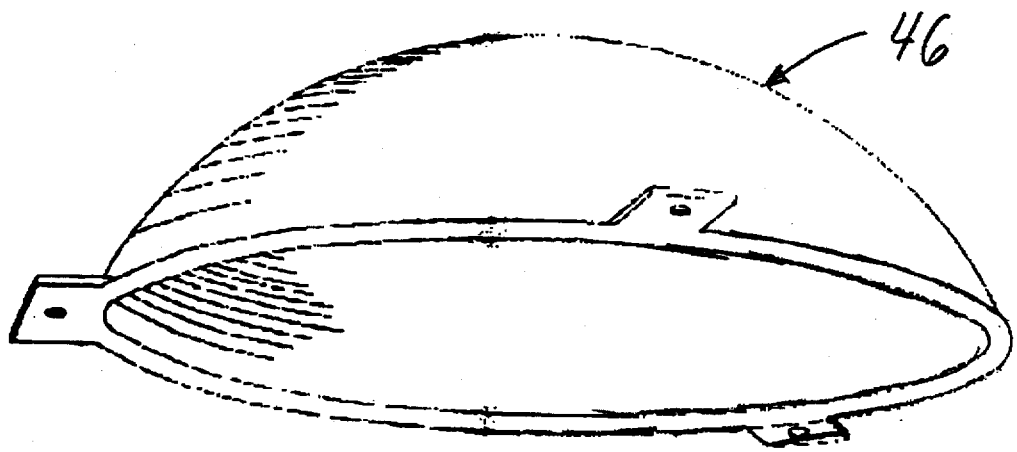
FIG. 8 shows a three-dimensional view of the heat radiation preventing device having a dome shaped cap.

In the heating operation, wafer (200) is heated in the second space formed in vacuum chamber (100) by contacting cap (46) to the surface of heater table (21). Therefore, not only can the heating time of wafer (200) be shortened sharply compared to that in the conventional method, but also wafer (200) can be heated to a uniform temperature. Cap (46) may have a cylindrical body as shown in FIG. 7, or may have a dome shape as shown in FIG. 8. To explain this in more detail, wafer (200) is wrapped by cap (46), which prevents the heat generated from the surface of heater table (21) from escaping into vacuum chamber (100) and focuses heat on inside cap (46). Especially, since the inner surface of cap (46) above is coated with reflecting film (48), wafer (200) is warmed by the heat generated from the surface of heater table (21) and reflected on reflecting film (48) formed on the inner surface of cap (46). The heated gas from the gas supply tube of heater table (21) diffuses into the inner part of cap (46), then exhausts through the gas outflow opening formed between main body (46a) of cap (46) and top side (46c) to heat wafer (200) to a uniform temperature. Finally, the adsorption of impurities by the surface of wafer (200) in vacuum chamber (100) can be reduced.

In the case of installation of heat generating device (50) like electric heating wire (51) as shown in FIG. 6 or halogen lamp (61) as shown in FIG. 7 inside cap (46) in another example of this invention, the upper and lower part of wafer (200) can be heated by both heater table (21) and electric heating wire (51) to double the heating effect.

According to experiments by this inventor as shown in FIG. 7, the heat treatment time for a wafer can be shortened using the heat treatment device of this invention (curve A in this figure) compared to that by the conventional device (curve B in the figure).

If the heat treatment of the wafer is complete, the rod is then elevated by a transfer device to separate heater table (21) from cap (46). Center rod (33) is raised by bellows (33a) to lift wafer (200) by the pins installed on the cross section of the center rod, and lifted wafer (200) is discharged by the above manipulator.

The heat treatment device in this invention reduces the time required for the heat treatment of a foil sheet or wafer, and therefore can improve the productivity.

What is claimed is:

1. A thin film heat treatment apparatus for heating
   a vacuum chamber; and
   a head radiation preventing device installed adjacent to the heater table and forming an airtight space with a top of the heater table by covering the workpiece placed on the top of the heater table, the heat radiation preventing device comprising:
   a cylindrical main body having edges and a top side, the top side being attached to the edges of the main body,
   a cap with a fixed part protruding radially from the circumference of the cylindrical main body, and
   a lifting device attached to the fixed part of the cap.

2. The thin film heat treatment apparatus of claim 1, wherein the cap is formed in a dome shape.

3. The thin film heat treatment apparatus of claim 2, wherein the inner surface of the top side facing the top of the heater table is coated with a reflecting film.

4. The thin film heat treatment apparatus of claim 2, further comprises a heat generating device which is disposed contacting the inner part of the top side of the cap.

5. The thin film heat treatment apparatus of claim 4, wherein the heat generating device further comprises an electric heating wire.

6. The thin film heat treatment apparatus of claim 5, wherein the cap has a gas outflow opening.

7. The thin film heat treatment apparatus of claim 4, wherein the heat generating device further comprises a halogen lamp.

* * * * *